US010867084B2

(12) United States Patent
Hauenstein

(10) Patent No.: US 10,867,084 B2
(45) Date of Patent: Dec. 15, 2020

(54) METHODS AND SYSTEMS ARCHITECTURE TO VIRTUALIZE ENERGY FUNCTIONS AND PROCESSES INTO A CLOUD BASED MODEL

(71) Applicant: Mark Hauenstein, Reno, NV (US)

(72) Inventor: Mark Hauenstein, Reno, NV (US)

(*) Notice: Subject to any disclaimer, the term of this patent is extended or adjusted under 35 U.S.C. 154(b) by 538 days.

(21) Appl. No.: 15/069,321

(22) Filed: Mar. 14, 2016

(65) Prior Publication Data

US 2016/0195291 A1    Jul. 7, 2016

Related U.S. Application Data

(62) Division of application No. 14/203,576, filed on Mar. 11, 2014, now Pat. No. 9,343,903.
(Continued)

(51) Int. Cl.
*G06F 30/20* (2020.01)
*F24F 11/30* (2018.01)
(Continued)

(52) U.S. Cl.
CPC .............. *G06F 30/20* (2020.01); *F24F 11/30* (2018.01); *F24F 11/62* (2018.01); *H02J 3/00* (2013.01);
(Continued)

(58) Field of Classification Search
CPC ........... F24F 11/30; F24F 11/62; G05B 15/02; G06F 1/206; G06F 3/016; G06F 17/5004;
(Continued)

(56) References Cited

U.S. PATENT DOCUMENTS 4,852,054 A * 7/1989 Mastandrea ........ G01F 23/0076
702/51
4,863,279 A * 9/1989 Markel .................... G01K 3/06
374/109
(Continued)

FOREIGN PATENT DOCUMENTS

EP    2366133    9/2011
EP    254132     5/2012
(Continued)

OTHER PUBLICATIONS

Abdel-Ghany, A. M., et al. "A method for measuring greenhouse cover temperature using a thermocouple." Biosystems Engineering 95.1 (2006). pp. 99-109. (Year: 2006).*
(Continued)

*Primary Examiner* — Kamini S Shah
*Assistant Examiner* — John E Johansen
(74) *Attorney, Agent, or Firm* — Daly, Crowley, Mofford & Durkee, LLP

(57) ABSTRACT

A system for creating an energy performance and predictive model. The system includes a non-transitory computer-readable storage medium which performs the steps obtaining parametric information objects that represent actual physical objects and modifying the parametric information objects by embedding data related to energy performance characteristics unique to the device represented. The system further performs the steps grouping the modified parametric information objects that define actual real world interrelationships to create a complete virtualized project and parsing the virtualized model data set to create a first parsed data set and a second parsed data set. The first parsed data set creates the project system control application, which acts upon and coordinates the actions of the real device through the virtual field bus. The second parsed data set creates the project's virtualized energy performance project and represents the
(Continued)

RADIANT / THERMAL SENSOR subset of the virtualized performance environment where other virtualized devices can act upon it.

18 Claims, 9 Drawing Sheets

Related U.S. Application Data

(60) Provisional application No. 61/784,100, filed on Mar. 14, 2013.

(51) Int. Cl.
*F24F 11/62* (2018.01)
*H02J 3/00* (2006.01)

(52) U.S. Cl.
CPC ........... *H02J 2203/20* (2020.01); *Y02E 60/00* (2013.01); *Y04S 40/20* (2013.01)

(58) Field of Classification Search
CPC ...... G06F 17/5009; G06F 30/13; G06F 30/20; G06T 19/006; H02J 3/00; H02J 2003/007; H02J 2203/20; Y02E 60/76; Y02E 60/00; Y04S 40/22; Y04S 40/20
USPC ........................................................ 703/13
See application file for complete search history.

(56) References Cited

U.S. PATENT DOCUMENTS

| | | | |
|---|---|---|---|
| 5,333,784 A * | 8/1994 | Pompei | G01J 5/04 236/91 C |
| 6,116,512 A | 9/2000 | Dushane et al. | |
| 6,207,937 B1 * | 3/2001 | Stoddard | C23C 16/52 219/483 |
| 6,351,693 B1 | 2/2002 | Monie et al. | |
| 6,749,335 B2 | 6/2004 | Gauthier et al. | |
| 6,832,120 B1 | 12/2004 | Frank et al. | |
| 6,868,293 B1 | 3/2005 | Schurr et al. | |
| 7,000,849 B2 | 2/2006 | Ashworth et al. | |
| 7,130,719 B2 | 10/2006 | Ehlers et al. | |
| 7,261,241 B2 | 8/2007 | Eoga | |
| 7,317,970 B2 | 1/2008 | Pienta | |
| 7,364,093 B2 | 4/2008 | Garozzo | |
| 7,454,269 B2 | 11/2008 | Dushane et al. | |
| 7,524,107 B1 | 4/2009 | Lorenz | |
| 7,575,179 B2 | 8/2009 | Morrow et al. | |
| 7,661,878 B1 | 2/2010 | Lall et al. | |
| 8,050,801 B2 | 11/2011 | Richards et al. | |
| 8,091,795 B1 | 1/2012 | McLellan et al. | |
| 8,255,090 B2 | 8/2012 | Frader-Thompson et al. | |
| 8,276,829 B2 | 10/2012 | Stoner et al. | |
| 8,280,536 B1 | 10/2012 | Fadell et al. | |
| 8,289,182 B2 | 10/2012 | Vogel et al. | |
| 8,321,885 B2 | 11/2012 | Pino, Jr. et al. | |
| 8,336,095 B2 | 12/2012 | Lam et al. | |
| 8,457,802 B1 | 6/2013 | Steven et al. | |
| 8,660,708 B2 | 2/2014 | Narayanamurthy et al. | |
| 8,682,635 B2 | 3/2014 | Sayyar-Rodsari | |
| 2008/0033786 A1 | 2/2008 | Boaz et al. | |
| 2009/0132060 A1 | 5/2009 | Jenks | |
| 2010/0127889 A1 | 5/2010 | Vogel et al. | |
| 2010/0211224 A1 * | 8/2010 | Keeling | F24F 13/0209 700/277 |
| 2011/0016466 A1 | 1/2011 | Yao | |
| 2011/0046792 A1 | 2/2011 | Imes et al. | |
| 2011/0205965 A1 | 8/2011 | Sprigg et al. | |
| 2011/0251807 A1 * | 10/2011 | Rada | G01D 4/00 702/61 |
| 2012/0232701 A1 | 9/2012 | Carty et al. | |
| 2012/0239221 A1 | 9/2012 | Mighdoll et al. | |
| 2012/0266087 A1 | 10/2012 | Edecker et al. | |
| 2012/0284718 A1 | 11/2012 | Dahlstedt | |
| 2012/0303828 A1 | 11/2012 | Young et al. | |
| 2014/0058572 A1 | 2/2014 | Stein et al. | |
| 2014/0142904 A1 | 5/2014 | Drees et al. | |

FOREIGN PATENT DOCUMENTS

| | | |
|---|---|---|
| EP | 2525462 | 11/2012 |
| EP | 2528302 | 11/2012 |
| WO | 2010059143 | 5/2010 |

OTHER PUBLICATIONS

Prediction of Room Thermal Response by CFD Technique with Conjugate Heat Transfer and Radiation Models, by Chen, Peng, and Paassen, ASHRAE, Jan. 2013.
Usability of Residential Thermostats: Preliminary Investigations, by Meier, at al., Mar. 2011.
Development of an HVAC Load Model for Aggregates of Homes, by Burke and Auslander, Jun. 2010.
Object-Oriented DDC Documentation, by Gulotte, ASHRAE, 1989.
Yeung, et al., "Modeling and Control of Flexible Conveyor Systems for Automated Assembly," Fieldbus Technology, N.P. Mahalik (Ed.), Chapter 6, Springer-Verlang Berlin Heidelberg, 2003.
Bernal, et al., "MLE+: A Tool for Integrated Design and Deployment of Energy Efficient Building Controls," Buildsys'12, Nov. 6, 2012.
Azhar, et al., "BIM-Based Sustainability Analysis: An Evaluation of Building Performance Analysis Software," Proceedings of the 45th ASC Annual Conference, 2009.
Ellis, et al., "Simulation of Energy Management Systems in EnergyPlus," Presented at Building Simulation, 2007.
Wetter, et al., "A Modular Building Controls Virtual Test Bed for the Integration of Heterogeneous Systems," Lawrence Berkley National Laboratory, Aug. 22, 2008.
Yang, et al., "Development of Building Automation and Control Systems," 2012 IEEE Design & Test of Computers, Aug. 1, 2012.

* cited by examiner

FIG. 1 PARAMETRIC TO VIRTUALIZED OBJECT FLOW CHART

VIRTUALIZED MODEL

CONSUMPTION MODEL

GENERATIONAL MODEL

VIRTUALIZED ENVIRONMENT

TRANSACTIONAL FLOW CHART

VIRTUALIZED THERMOSTAT

RADIANT / THERMAL SENSOR

METHODS AND SYSTEMS ARCHITECTURE TO VIRTUALIZE ENERGY FUNCTIONS AND PROCESSES INTO A CLOUD BASED MODEL

CROSS-REFERENCE TO RELATED APPLICATIONS

This application is a divisional application of U.S. patent application Ser. No. 14/203,576, filed Mar. 11, 2014 which claims the benefit of and priority to U.S. Provisional Patent Application Ser. No. 61/784,100 filed on Mar. 14, 2013, which application is incorporated herein by reference in its entirety.

BACKGROUND OF THE INVENTION

The current US electrical energy grid architecture is inefficient. According to the DOE, 45 percent of energy produced by the electric grid generators, on a BTU basis, is lost. A major portion of this power is generated by fossil fuels and millions of metric tons of carbon emissions are released into the atmosphere annually to support this massively inefficient and antiquated centralized electrical grid architecture.

In 1996, under Federal Energy Regulatory Commission (FERC) Order 888, the establishment of independent service operators (ISO's) began the process of recognizing the separation of generation, transmission, and power distribution into separate entities that exist to transition the electrical power grid into open electric grid market functions. This was followed up by FERC Order 2000 in 1999 for directing open wholesale electrical markets. Similar trends have occurred in the natural gas delivery markets. Since the inception of wholesale markets, the market model has placed pooling of generations sources and dispatching of resources across the grid in a transparent and unbiased way, allowing for market pricing and regional needs to drive market demand pricing. The current legacy grid model does not distinguish between generations sources, identify environmental effects, inherent losses that lead to inefficiencies and unaccounted for impact costs. Further, until the introduction of smart meters, grid operators had very little granular information about what was happening at the point of dispatched power and this was a problem. As a result of alternate energy sources such as wind and solar and as the grid became interconnected and diversified, more problems were encountered with fluctuations outside the control of traditional legacy grid operators Currently, grid operators establish predictions on consumption levels for major demand response events and then reconcile days later the information and how various operators contributed to the demand response event. As grid operators have struggled with modeling the generational sources and their interrelation challenges with consumption, it is clear a comprehensive model of source and consumption is needed.

Parallel to electrical market deregulation, DOE, FERC and EPA as directed by Presidential Executive Order 13624 through the use of combined heat and power (CHP) have identified a concept where waste heat generated from any process should be considered as a source to generate electricity, which by its very nature places electricity generation closer to the point of consumption as being more efficient with a low overall impact to the environment. The distribution and utilization of fossil fuels, in particular natural gas, with all of its benefits as a second source of local electrical generation has not been integrated into an overall energy solution. It is also necessary to look at fossil fuels with the ability to segregate traditional combustion of fuels to generate electricity that create higher levels of greenhouse gases from fuel cells that produce electricity more efficiently with lower $CO_2$ impact.

Recent hurricanes and natural disasters have shown the weakness in reliability of aging, large legacy grid systems and the need for a distributed grid architecture. This coupled with NetZero development trends predict a new distributed electric power grid architecture for new infrastructure and upgrade plans for existing grid replacements. This invention lays out an architecture where all market forces are accounted for in real time with real time market exchange, while allowing grid operators the freedom to interact with predictive and multilevel tiered pricing structures.

This invention and its various embodiments is to model energy flow as source raw materials to power plants, power and heat generation and generational losses with by products, transmission/reactive losses, congestion/distribution processes and consumption elements and devices in a virtualized cloud environment. The modeling environment is created using a compilation of virtualized parametric objects created or modified within the parametric design process to represent real physical devices. These objects are then parsed to yield virtualized energy elements that interact with both consumption and generation models. The smallest unit of virtualized consumption is any process or entity directly or indirectly requesting any form of energy. Energy sources are virtualized with a full attribute structure including source, heat content, greenhouse gases (GHG), water, transmission distance losses relative to the individual consumer. And as the virtualized model begins to account for all associated costs incurred by legacy electrical generation (ISO's), normalized costing across all metrics will drive innovation in areas of distributed electrical grid architecture and carbon sequestration in an open market environment.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One example embodiment includes a system for creating an energy performance and predictive model. The system includes a non-transitory computer-readable storage medium including instructions that, when executed by a computing device, cause the system to create virtualized energy objects that represent physical systems, characteristics, and performance by performing the steps obtaining parametric information objects that represent actual physical objects and modifying the parametric information objects by embedding data related to energy performance characteristics unique to the device represented. The system further performs the steps grouping the modified parametric information objects that define actual real world interrelationships to create a complete virtualized project and parsing the virtualized model data set to create a first parsed data set and a second parsed data set. The first parsed data set creates the project system control application, which acts upon and coordinates the actions of the real device through the virtual field bus. The second parsed data set creates the project's virtualized energy performance project and represents the subset of the virtualized performance environment where other virtualized devices can act upon it.

A virtual thermostat for virtualizing energy functions and processes. The virtual thermostat includes a sensor array. The sensor array includes an interior temperature sensor at a thermostat location, where the interior temperature sensor is configured to measure the temperature within an interior space. The virtual thermostat also includes an outdoor temperature sensor, where the outdoor temperature sensor is configured to measure the temperature sensor of an outdoor location in proximity to the interior space. The virtual thermostat further includes a supply air temperature sensor, where the supply air temperature sensor is configured to measure the temperature of conditioned air that is being supplied to the interior space. The virtual thermostat additionally includes one or more computer readable media, where the one or more computer readable media contain a set of computer-executable instructions to be executed by the logic device. The set of computer-executable instructions configured to receive input from the sensory array and create a unique representation of the physical systems controlled. The set of computer-executable instructions also configured to create a unique data set of the virtualized systems and connect this data set to other networked devices using machine to machine interaction and allow the virtualized thermostat to share simple user data and user requests with other consumption or generational models. The set of computer-executable instructions further configured to allow the data set representing the virtualized thermostat to exist outside of the controlled system and employ sophisticated control logic/algorithms to output one or more control signals designed to affect the desired conditioning.

These and other objects and features of the present invention will become more fully apparent from the following description and appended claims, or may be learned by the practice of the invention as set forth hereinafter.

BRIEF DESCRIPTION OF THE DRAWINGS

To further clarify various aspects of some example embodiments of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
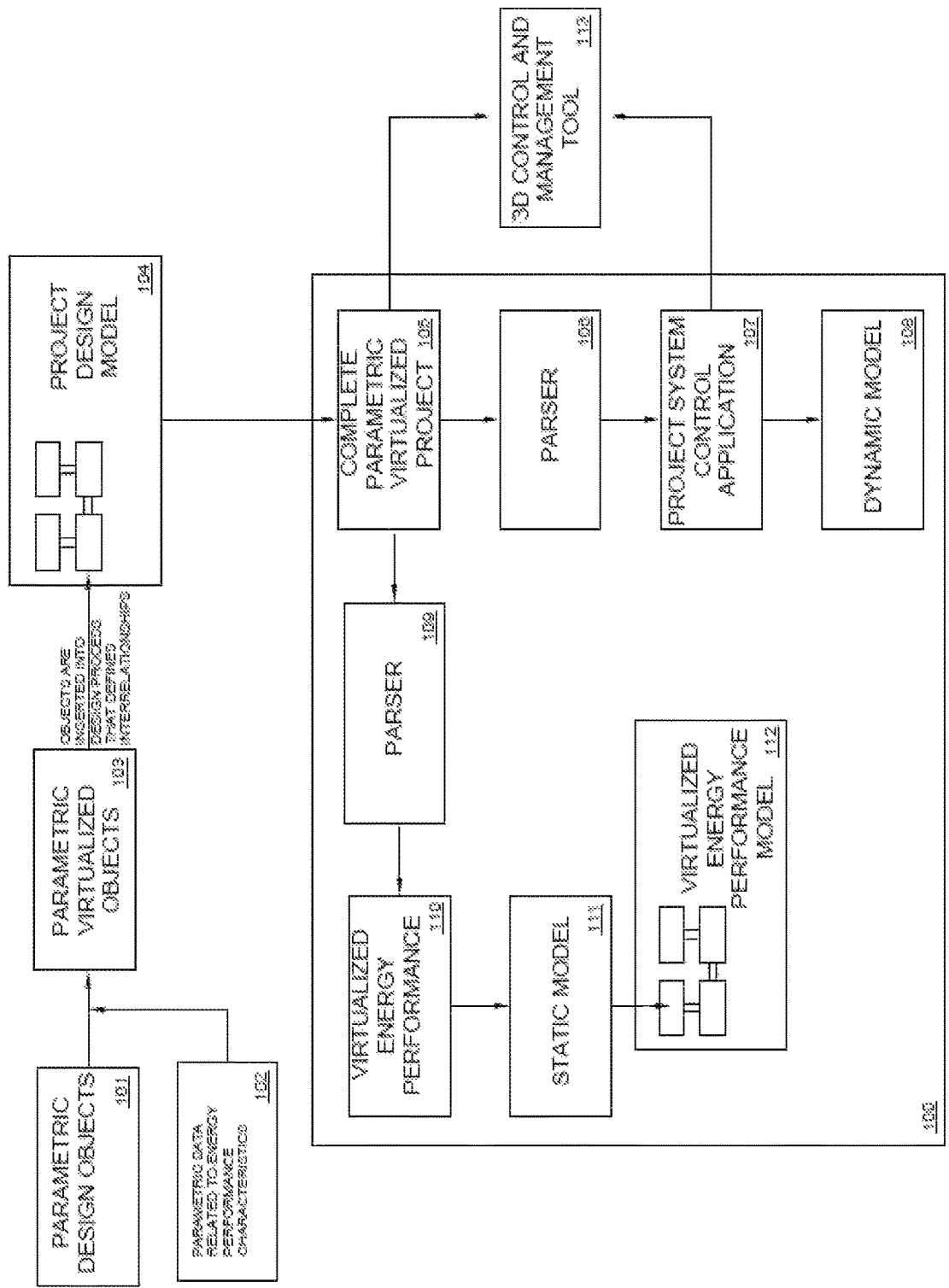
FIG. 1 illustrates the parametric to virtualized object flow chart.

Reference will now be made to the figures wherein like structures will be provided with like reference designations.

It is understood that the figures are diagrammatic and schematic representations of some embodiments of the invention, and are not limiting of the present invention, nor are they necessarily drawn to scale.

Definitions:

"Parametric Virtualized Object"—The compilation of objects created or modified within the parametric design process (3D design, Building Information Modeling (BIM)) comprised of parametric attributes, metadata, or some other machine readable code that is the basic unit to the virtualized environment. With respect to this invention, the virtualization of objects have specific parametric data included that represent the Object's energy and performance characteristics that are common and standardized across the entire virtualized environment.

"Bayes Theorem"—Gives relationship probabilities of A and B, $P(A)$ and $P(B)$, and the conditional probabilities of A given B and B given A where: [0025] $P(A|B)=P(B/A)*P(A)/P(B)$; where the degree of probability in a proposition before and after accounting for evidence. With respect to this invention, we use Bayesian interpretation to make predictions within the dynamic model and pinpoint performance issues when compared to the actual results.

"Cloud Computing"—A phrase used to describe a variety of computing concepts that involve a large number of computers connected through a real-time communication network such as the Internet. In science, cloud computing is a synonym for distributed computing over a network, and means the ability to run a program or application on many connected computers at the same time.

"Virtualized User"—The smallest unit of virtualized consumption. The smallest unit would be a virtualized representation of a single plug-in appliance, the estimated energy consumed to process a transaction, or any entity directly or indirectly requesting any form of energy.

"Virtualized Device"—A virtualized device is any software representation of a real physical component or entity that contain the same attributes and responds in the same way as the real device.

"Virtualized Consumer"—Any software representation of a person or being, an entity with attributes used to describe relationships with virtualized elements.

"Virtualized Field Bus (VFB)"—A software representation of a data field bus containing input and output variables where some points of data may interface the virtualized data with real physical data.

"Virtualized Generational Element"—Any software representation of steps, processes, methods, or concepts in part or in total that create electrical energy and/or heat.

"Ancillary Services"—Any method or representation that improves the delivery of the utility grid which can include any physical apparatus attached to any portion of the grid or as virtualized portions of the grid that are manipulated through software to improve, modify, or optimize grid power factor or performance using anticipation, synchronization, or limiting algorithms.

"System Control Application"—The control algorithms, senor and device interrelationships that allow for control and performance as intended by the system designer.

This invention and its various embodiments is a virtualized model that exists within cloud computing environment. The model is comprised of object oriented modules developed in a well-established software environment such as Java that represent both energy generation and consumption within the virtualized environment.

In order to create the virtualized environment 100 for a given construct, FIG. 1 illustrates parametric virtualized objects 103 with specific information embedded within the object's attributes are joined as a compilation of objects created or modified within the parametric design process (3D design, BIM). And as objects are inserted into the project design model 104, parametric attributes, metadata, or some other machine readable code, defines the basic relational organization for all virtualized devices and forms the basis of the parametric design model.

The parametric design model can be created as part of an engineered project to describe a construction project 105, an existing project conditions, or using any method available and a standardized template with the end product established as describing a virtualized energy consumption or generation device.

The parametric design model includes virtualized consumption elements or devices for control, management, life cycle costs, consumption priority, predictability, and strategies for energy consumption requests and predictive energy usage.

The parametric design model includes virtualization of energy generation, management, life cycle costs, availability, predictability, transmission, distribution, and consumption elements. Energy generation will be virtualized into energy types, harvested at the source (coal, oil, natural gas, solar, hydroelectric, nuclear, biomass, etc.) and energy consumption can be broken down into individual energy users.

Once the parametric design model is completed it is verified in virtualization mode to confirm the component performs as the actual device it represents, it is said to be characterized. Once characterized, the parametric model undergoes two separate but parallel parsing operations.

The first parsing operation 106 extracts the project system control application data from the parametric data contained within each object. This metadata, or some other machine readable code, defines the basic relational organization and sequences for all devices within the real project environment. Once this data is parsed and verified, it becomes the basis of the dynamic model and the system control application. Using uniform resource locator (URL), polymorphism, or a combination of linking methods to relate and update in real time the parsed data to the original parametric model, a 3D real time control and management tool is created.

The second parsing operation 109 extracts the virtualized energy performance data from the parametric data contained within each object. This metadata, or some other machine readable code, defines a virtualized device within the static model to be described below. It is worth noting that the two parsed data sets are parsed differently: one is parsed to create a data file used for the basis of a control platform and open connectors to the virtual field bus, the second is parsed to operate independently in the virtualized environment and open connectors to the predictive model data set.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 2:
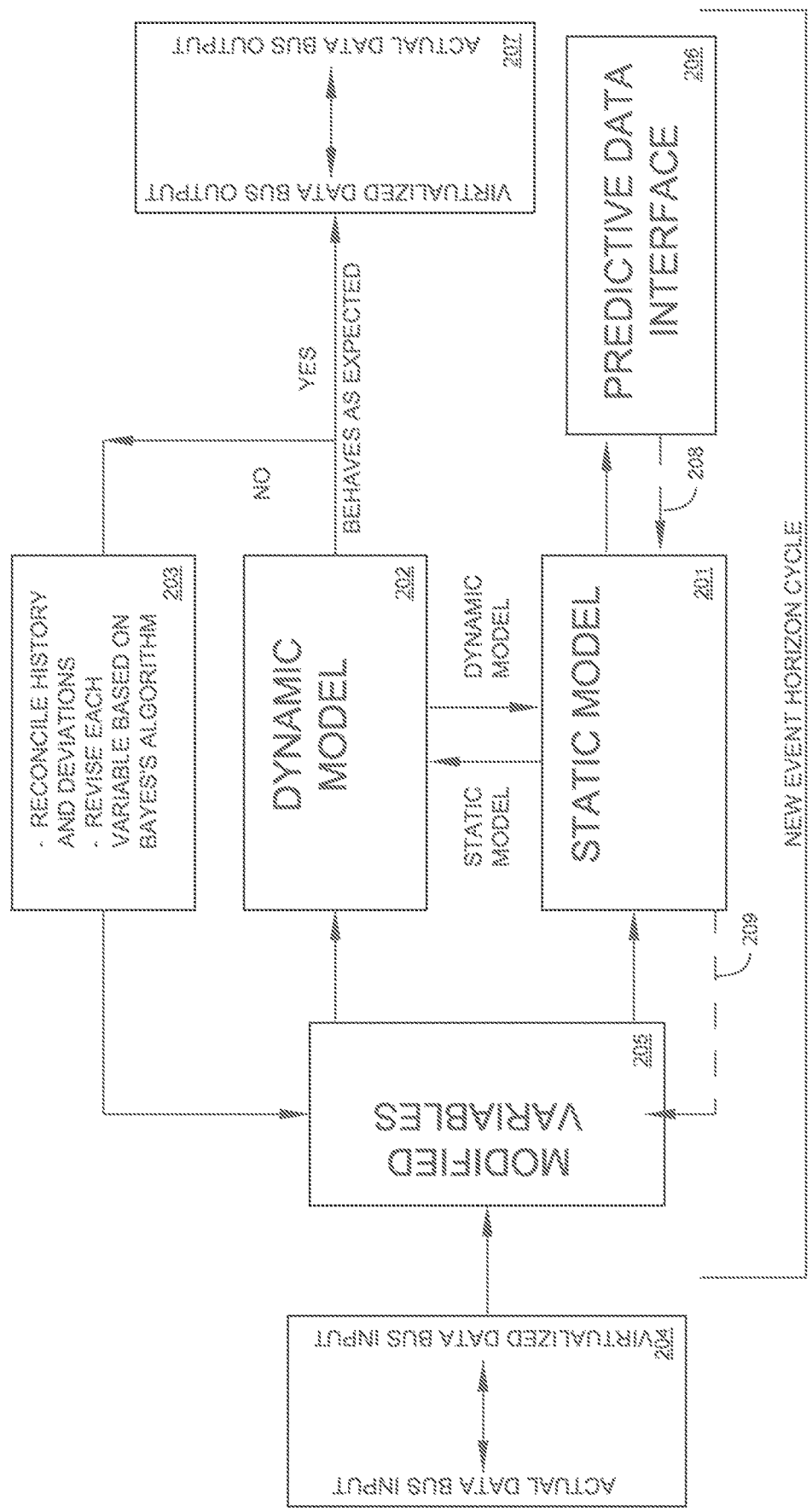
FIG. 2 illustrates a virtualized model consisting of a static and dynamic component.

As the virtualized environment develops, each device exists both as a static model 201 and dynamic model 202 at each level of the construct as illustrated in FIG. 2. The portion of the virtual field bus that is comprised of the actual data bus input 204 and output 207 is the only portion of the construct that resides at the consumption or generation device. Once these data points are mapped to the virtualized data bus as normalized values, the rest of the model can be segregated across multiple processors, differentiated, and stored as need across multiple data base platforms. The benefit should be obvious with the ability to read or write one variable across a large scaled deployment of comparable devices.

In order for the dynamic model to respond, it must first look at the modified variables 205 that it is presented and determine if the static model 201 and the dynamic model 202 match in response. If the two models match, the output is written to the virtualized data bus output and sent out to affect change. If the two models do not match, the variations between the static and dynamic model are reconciled and returned to the predictive data interface 206. By the use of two virtualized independent models and synchronizing/comparing the results, it is possible to overcome the limit of processing a variable data set with second order or higher equations or nested relational values in real time. The result is the use of a static model to process equations and keep the interface to the dynamic model: a comparator value.

The static model 201 contains a predictive algorithm 206 based on Bayes's Theorem to generate a user demand evaluation within the consumption model and a predictive solution, based on the generational model. Both models obtain field data 204 modified in real time, but only the dynamic model 202 can interact with the physical world at any point within the model. The dynamic model issues write commands to virtualized devices that interact with actual field devices, and affect changes within each virtualized device.

Figure 3:
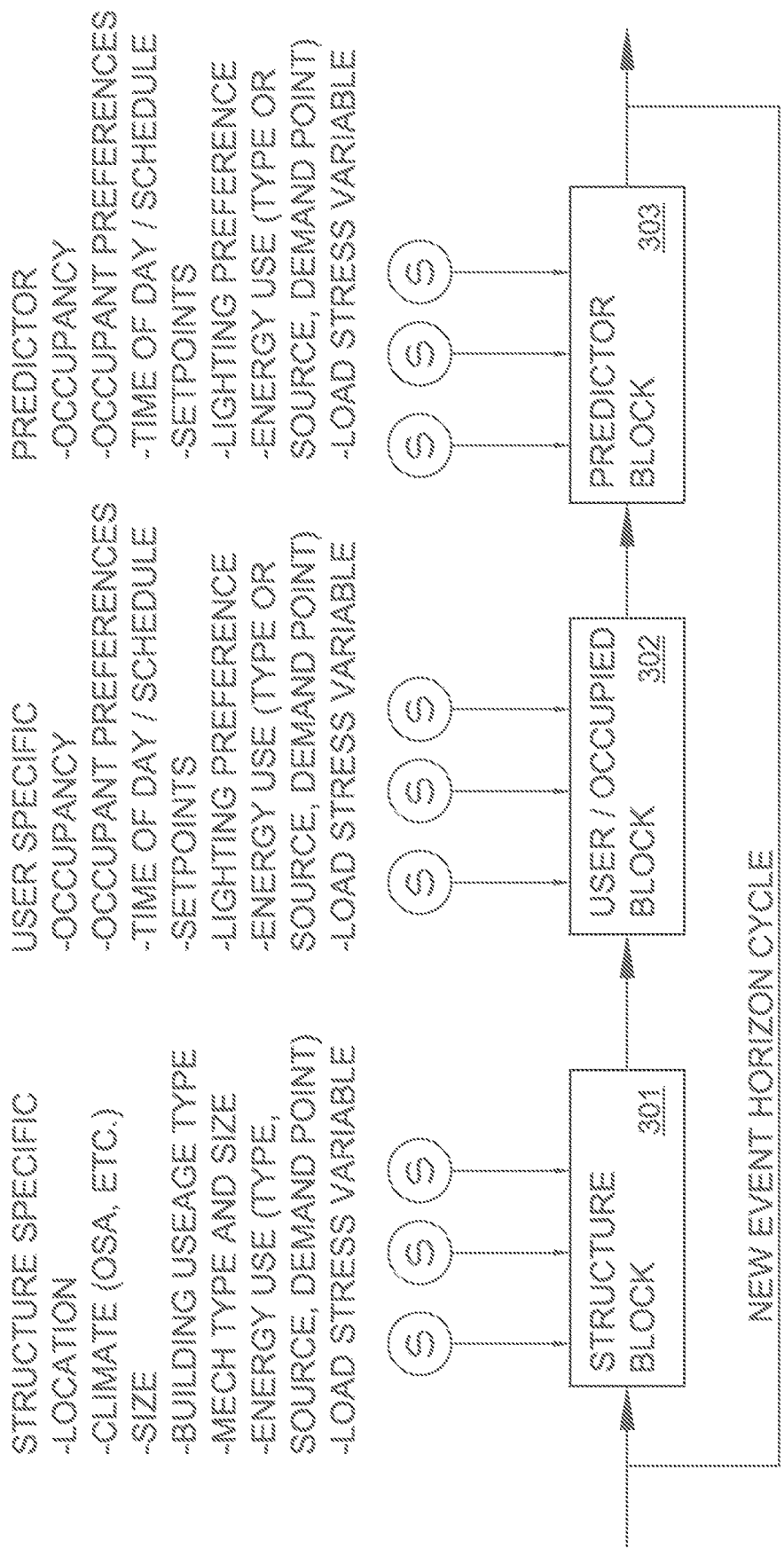
FIG. 3 illustrates a virtualized consumption model.

As illustrated in FIG. 3, the smallest unit of the virtualized consumption model or module is the individual user 302, with its preferences moving around within the consumption model 301. For each consumption device, there is a predictor block variable 303 that allocates estimated consumption requirements, summarizes preferences and passes this data back to the aggregated virtualized consumption.

Figure 4:
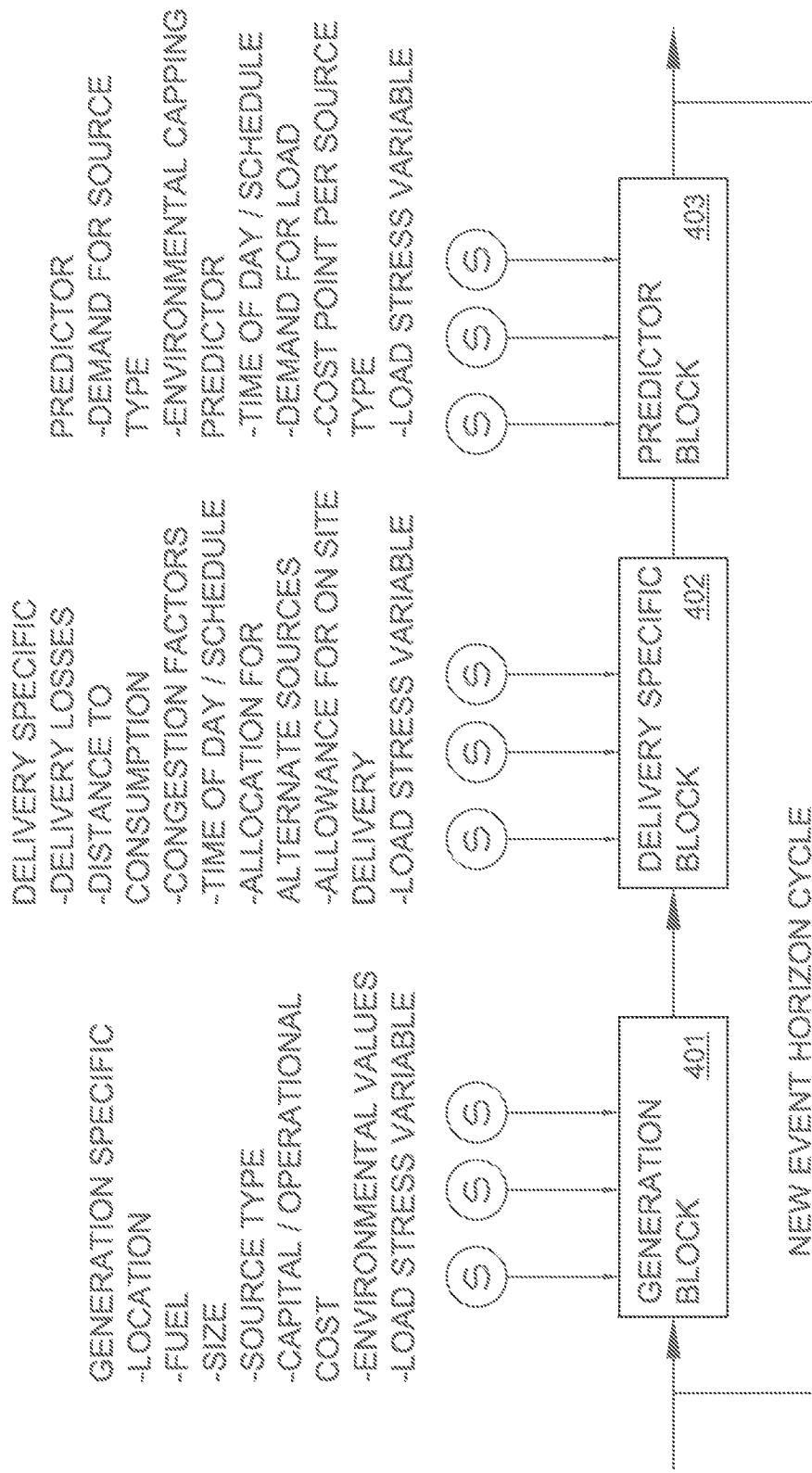
FIG. 4 illustrates a virtualized generational model.

As illustrated in FIG. 4, the smallest unit or module within the virtualized generational model is the generational source, comprised of all of its generational costs including environmental, source, capital costs and anticipated future costs for each source type, delivered to each user's point of use within the virtualized grid. For each generational device, there is a predictor block variable 403 that establishes a generational capacity along with cost point, environmental capping, cost point per source, and source type and this data is passed back to aggregated virtualized consumption within the virtualized environment.

The current state of art for energy consumption and demand response is to allow utility grid operators to define a daily rate structure and time of day demand events. These events and pricing are developed by independent service operators (ISO's) on given generation capacity and anticipated demand consumption with final cost factors resolved at some later date.

Figure 5:
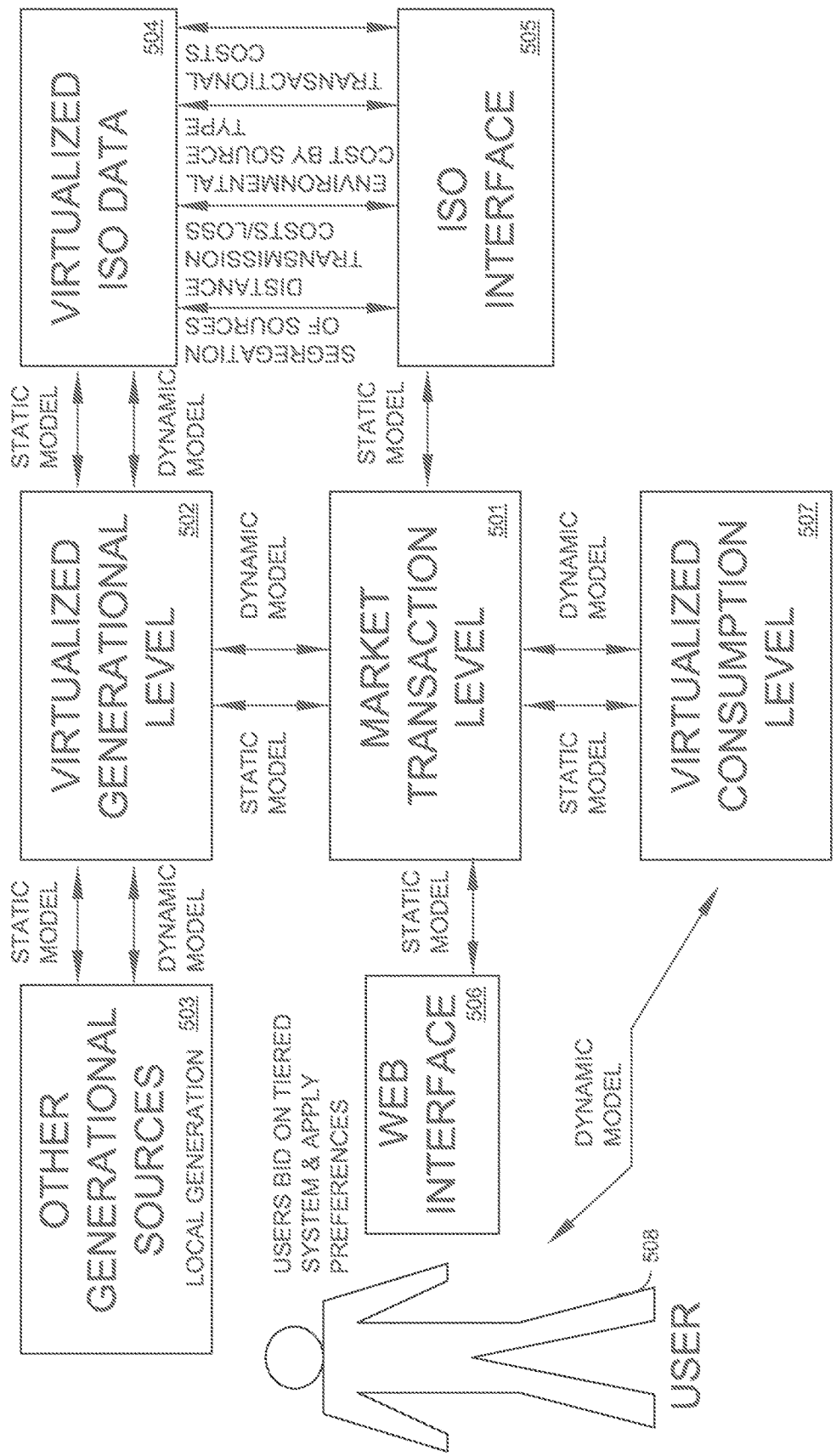
FIG. 5 illustrates the virtualized environment.

FIG. 5 represents the overall virtualized environment that brings together the market transaction level 501, which is the central exchange and interface between the consumption 502 and generational 507 portions of the system architecture manages two distinct computational paths: the static and dynamic model.

Within the virtualized consumption model, individual users 508 are given purchasing choices via web based tools to select the types of energy sources and cost point.

Energy sources 504 are virtualized with a full attribute structure including source, greenhouse gases (GHG), water, transmission distance losses to create normalized costing specific to the individual consumer or virtualized device. Premium sources of energy such a solar PV are costed against the full acquisition cost of fossil fuels that includes source harvesting and carbon sequestration costs. Consumers will select energy sources based on personal eco objectives using a connected device, web, or social networks that will drive change in personal behavior. Once consumers are given choices and begin to drive the demand for alternate, local, sustainable sources, the paradigm for generators will be switched from a demand reduction to a distributed, carbon neutral electrical grid architecture where consumers can be collective, cooperative, bundled, or agent representative and tracked in real time.

And as the virtualized model begins to account for all associated costs incurred by legacy electrical generation (ISO's) 505, normalized costing across all metrics will drive innovation in areas of distributed electrical grid architecture and carbon sequestration in an open market environment. For example, California consumers will see their consumption of coal fired power generation in a distant State that still allows air quality standards for California generators exceeded in real time. States and grid operators that charge punitive rates will be identified and market forces will drive new alternatives and options.

First Implementation—Thermostat

The first implementation of the virtualized model is the basic thermostat. In its simplest form, the thermostat can make heating and cooling decisions and control mechanical equipment. Past art has found ways to make the thermostat smarter and more user friendly. Further, the thermostat may be network connected with algorithms that respond to utility demand commands/rate structures, while trying to maintain user comfort. I.e., it attempts to be more efficient without diminishing the user's experience.

But the basic model is flawed for numerous reasons including the simple fact that a thermostat is located in the wrong place, typically near the return air to the mechanical system and this location has little to do with occupant comfort. The latest research indicates that this placement of the thermostat leads to energy losses and occupant discomfort. That is, the thermostat does not really do anything to account for where the user is located when determining whether climate controls should be active or inactive.

Aside from the thermostat existing in a poor location to accurately determine comfort, the accuracy of the sensors used in industry standard thermostat lacks the accuracy and sensitivity to allow for virtualized modeling. Basic knowledge of process control uses proportional, integral, and derivative (PID) algorithms where the derivative or second order portion of the control is omitted. This omission may be the result of most on/off type control strategies having no way (i.e., lacking sufficient hardware) to accurately apply the derivative. Additionally or alternatively, the second order portion may be omitted because major manufactures of modern programmable thermostats implement inexpensive components and resistive temperature detector (RTDs) which may not carry the bit resolution to achieve a more accurate control of +/−2 degrees Fahrenheit as tested, or less accuracy with previous generation bimetal/mercury type sensors. Aside from cost and complexity, current thermostats, capable of accurate readings and responding to an accurate reading may lead to over cycling mechanical equipment.

Figure 7:
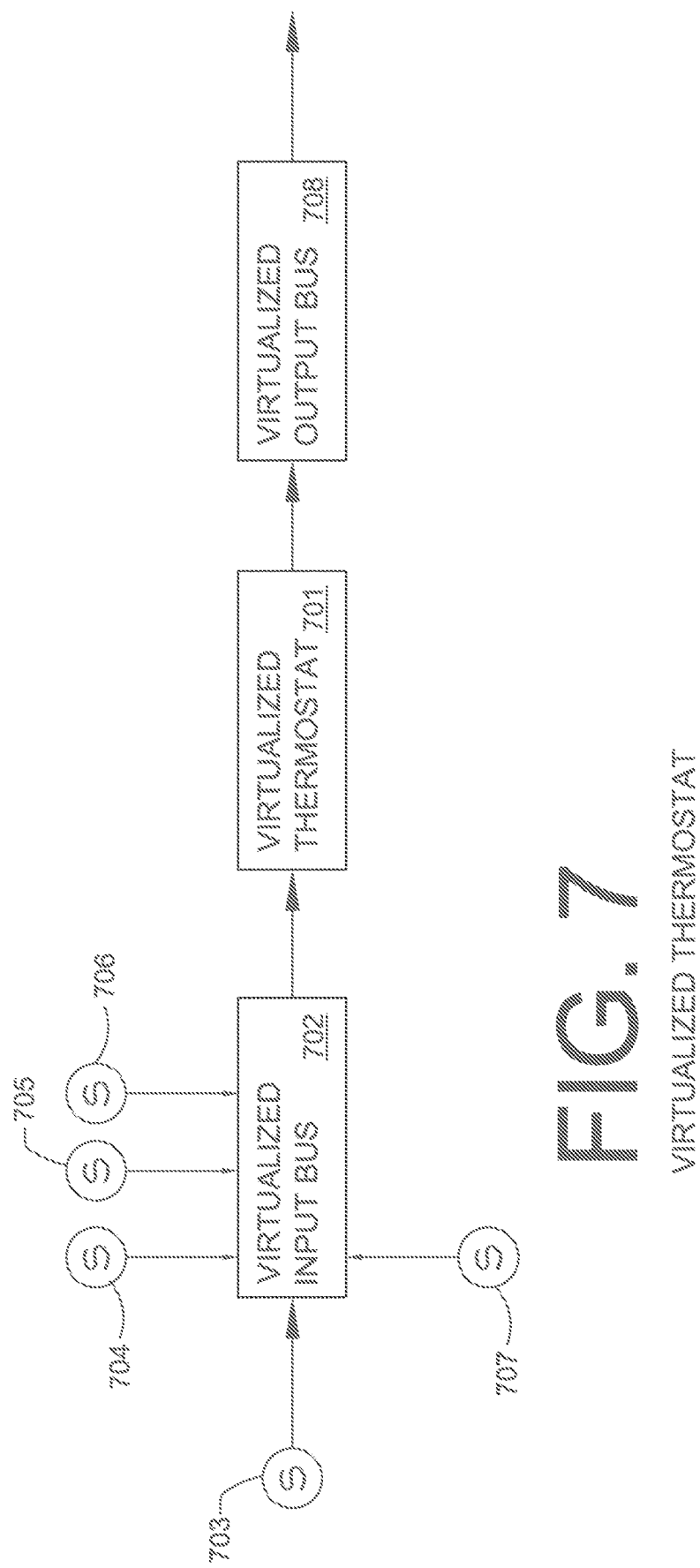
FIG. 7 illustrates the virtual thermostat components.

As illustrated in FIG. 7, the virtualized thermostat is comprised of 1 to 5 sensor types with an accuracy of approximately +/−0.75 degree Fahrenheit at 75.degree. F. and occupancy sensor inputs with outputs defined by heating, ventilating, cooling, humidification, dehumidification, and fan flow (air volume). As used in the specification and the claims, the term approximately shall mean that the value is within 10% of the stated value, unless otherwise specified.

Input sensors and their function number:

1. Temperature sensor at thermostat location 703—If we know that all the conditioned areas communicate with this location, the sensor will be used to determine the basic envelope and mechanical system performance. By measuring the outside air temperature 704 and "stressing" the system at design conditions with known system delivery capacity, it can be determined from the 2nd order drift and acceleration to set point, the actual heating cooling load experienced by the structure. In math terms, 2nd order acceleration is one factor in the proposed Bayes's predictor of anticipated performance.

2 Outdoor air temperature sensor 704—Research has indicated that micro climates exist so close to structures that the weather data fed from any source other than the structure itself is meaningless. An accurate outdoor air sensor can be located approximately 4'-0" above grade and away from any heat source or radiant influence. Again, the temperatures measured by the acceleration of change is the basis of predicted performance.

3 Supply air temperature 705—The supply air temperature is required to know the system status and performance. Supply air temperature, thermostat (cumulative), and outside air temperature, along with fan flow data, can provide a virtualized energy consumption profile that can be a subdivided energy set as used as a comparator to actual name plate loads. On systems with mechanical cooling, a sensor on the condensing unit provides the refrigeration efficiency feedback.

Figure 8:
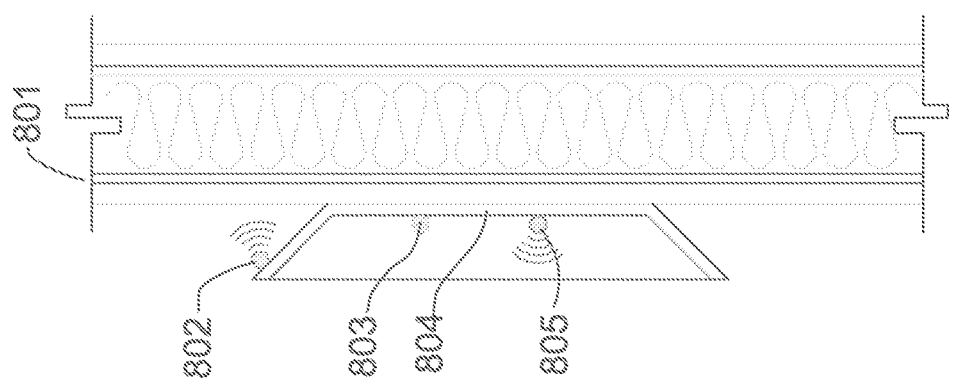
FIG. 8 illustrates a radiant/thermal sensor.

4 Radiant sensor 706—Many buildings employ temperature setback strategies to save energy. Temperatures in spaces in the building drift to near ambient conditions when the building is not occupied. When occupation reoccurs mechanical systems, which were designed for steady state load conditions, are now forced to overcome the mass load. The time the mechanical system is running and not meeting the thermostat set point as "unmet hours". Many times spaces are intentionally or unintentionally overheated or over cooled to compensate for this condition. Studies have indicated that occupant comfort is a compilation of thermal range and maintaining a radiant mean temperature, or that condition where the radiant temperature of surfaces within the space neither add to nor remove radiant effects to the occupant's body. The radiant sensor described here and illustrated in FIG. 8 is a frame mounted to an exterior wall 801 that senses using an Infrared (IR) sensor, the outside wall internal surface temperature 802. Simultaneously, a thermocouple can sample surrounding air temperature 803 (isolated from the wall using an insulated frame, 804) and an IR sensor to measure the IR temperature of the surroundings 805. This sensor provides information to our virtualized thermostat and provides feedback in creating radiant mean conditions.

5 Occupancy sensors 707—An ear, wrist, lapel, or smart device that is a connected device running an enabled energy service would register with the localized thermostat or some other wireless enabled device to send data to the cloud based virtualized thermostat. As each device registers with the virtualized thermostat the represents the localized thermostat, the space becomes "occupied". Similar to illustration of FIG. 8, each device may be capable of reading surface or skin temperature and include an IR sensor to read surrounding temperature.

Occupancy sensors will establish occupant conditions and individual preferences will be uploaded to the virtualized thermostat. As users move around the space, the thermostat will compensate to accommodate users' preferences. And as new users join the sensor network, their preferences and sensed conditions are pooled within the virtualized thermostat increasing accuracy of the model. Straight polling or hierarchy of users can establish localized space temperature set points depending on individual set points and associated dead band preferences, energy use/cost can be apportioned over all users present.

Virtualized thermostat outputs 708—By the nature of the software based virtualized model, the device is capable of outputting: step on/off, staged, linear sequenced, analog or any combination thereof. As shown in FIG. 2, between the sensors and output configuration is a modular block of objects to represent: (1) a structure, or envelope block, (2) an occupant block and (3) a predictive block, resulting in a responsive load variable.

The inputs 702 and outputs 708, identified within a specific consumption model, represent a virtualized field bus (VFB). The VFB in its virtualized form represents normalized values that allow for consistent representation and as a means of creating a scalable virtualized platform. Values within the VFB can be real, representations of real data or calculated.

Once inputs and outputs from the VFB are normalized, they are prepared to input to various portions of the control block diagram as represented in FIG. 3. For instance, the "structure block" class 301 as identified in FIG. 3 shows a list of variables that impact both the performance and the predicted performance of a thermostat/structure relationship. "Block" is defined as the set of equations or algorithms related to a specific step from input to response, IE structure block 301, user block 302, and predictor block The static and dynamic models are made up of segments within each block of calculations. The static model 201 begins each event horizon by starting the process with a stored variable. In Bayes's terms, this is the first predictor that was calculated from the original design model or as each event horizon occurs, is a modified value. What is passed between segment block variables is a simple numeric or enumerated state variable with a Laplace type matrix stored database. The dynamic model 202 and static model 201 each maintain a separate database. It is anticipated in some consumption models that multiple types of databases of each type will need to be maintained in order to describe the complexity of each model.

The dynamic model 202 is a closed loop that responds directly to the physical variables 204 or modified variables 205. The predictive data interface 206 is the connection between other virtualized devices and the dynamic model 202. In order for other virtualized devices to affect change within the dynamic model, the predictive interface 206 modifies a variable 208 within the static model 201 and the static model creates a variation state 209 within the modified variables 205. It is understood that the modified variable may or may not affect change immediately in real time to the dynamic model, but may change the prediction of how the system may respond in the future.

For example, the time of day for an event was modified a day in advance and in this case the dynamic model is unaffected and continues to perform as expected. If on the other hand, the static model changes the response state from "on" to "off". Before this change occurs, the dynamic model notes the change in state, reports this change to the predictive data interface, writes the new variable to the modified variables and changes the state to "off". One skilled in the art will appreciate that, a control loop could be modified to a lesser extent without an immediate "on" to "off" switch, but still bring about a change when you consider the adjustment scaled over a large infrastructure.

It is also possible, for example, that the dynamic model's state is changed from "on" to "off" by change at the physical device's switch. The static model tracks as a comparison model that predicts possible responses and variations between the static model and dynamic model represent measured performance within the transactional model level.

The virtualized thermostat reads very accurate input data, which it uses in predictive ways, but the actual response output is tuned and tempered by Bayesian interpretation algorithms and factors particular to the individual consumption instance. Solving mixed integer nonlinear equations using second order variables within a scalable model with input from local and networked sources and passing both complex and "simplified user understood data" requires a two model approach in a cloud based managed solution where one model keeps track of how the system operates in the physical world and the second model communicates with other virtualized devices and computes predicted responses and tracks comparisons.

Benefits of Implementation 1:

By its very nature, a virtualized thermostat can accept input from all types of sources and respond in a complex way, according to specifically tuned and/or predictive (Bayes's) responses.

A virtualized scalable model can contain information that can be presented in any form necessary to interface with simple human interaction or complex machine to machine interface. This allows for simple local user interface with complex control algorithms handled off site in the cloud environment.

By placing highly accurate sensors, it is not only necessary, but possible to enable the use of 2nd order equations to represent complex virtualized interactions and behaviors.

By using a sensor that reads both surface temperature and localized surrounding temperature, more accurate comfort decisions can be made to improve comfort and reduce energy consumption.

By placing consumption devices into a single virtualized model, it is possible to make small unnoticeable adjustments to individual control loops and group these changes to bring about large system synchronizations to control demand response and power factor loading.

By placing consumption devices into a virtualized model and using sensor input data, it is possible to apportion consumption from a single mechanical system or single consumption appropriately across multiple users.

By placing consumption devices into a virtualized model, it is possible to cross connect apportioned consumption of individual utility source types to individual virtualized consumption, based on user's preferences in real time.

Second Implementation—Utility Grid

This invention presents a novel approach to revise the current electrical grid delivery by using a virtualized model to segregate generational sources into separate generational types (solar, wind, hydro, coal, biomass, etc.) and deliver this to the consumer in such a way as to allow an open market bid on each unique generation type in real time and to identify all delivery costs associated with each particular generation type and its relative cost to deliver to a particular user. Accurate pricing in a multi-tiered form that represents all generational costs driven by eco social market forces will enable the possibility of a distributed power grid architecture.

As illustrated in FIG. 4 the object of this implementation is the virtualization of generation sources into unique energy types and identify all attributes of each type relative to its source, environmental costs (water use, $CO_2$ production, sulfur/NOx emissions, etc.) transmission costs/losses, and inter-operator exchange rates, to present consumers a tiered buying market approach. The generation block 401 contains the variables needed to describe a generation source, and delivery specific block 402 describes variables involved is getting the generated capacity to the point of distribution. The predictor block 403, describes the ability of any particular generation source to perform under certain loading conditions.

This implementation has two virtualized consumption models: one static 201, and one dynamic 202. The static model is the predictive model and interfaces with other virtualized devices using the predictive data interface 206 and the dynamic model interfaces directly physical devices in real time through the virtualized field bus 204 and 207.

Users 508 that participate in grid market pricing are presented a web interface 506 or some other connected device that identifies locations within the grid and a multi-tiered structure pricing. This information is then fed into the static virtualized consumption model 507. Resources are then aggregated within the market transaction static consumption model 501 and requests are sent via the ISO interface 505.

Within the virtualized consumption model 507, the user's past and present activities are tracked to incorporate them into the predictive model and requested electrical generation source and allocation of resource to be fed to the market transaction level 501.

Figure 6:
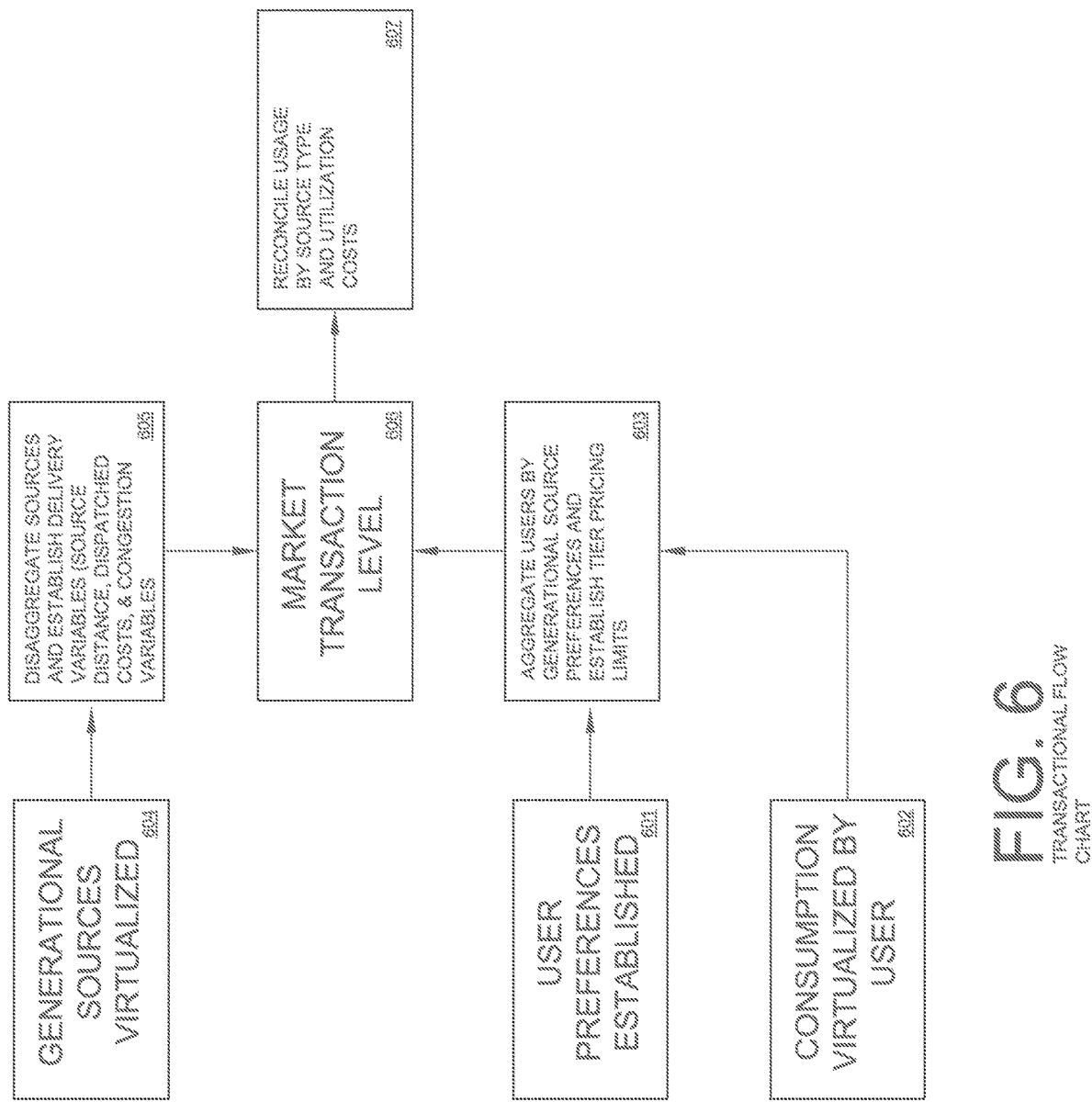
FIG. 6 illustrates the transactional flow chart.

For example, as shown in FIG. 6, the market transaction level matches user source requests 603 from multi-tiered pricing and actual virtualized consumption 602 against individual generation source types and costing values 605. Closure between the aggregated consumption requests 603 for each source type and the corresponding generational response 605 at each source type to is used to create a tiered pricing model 607 in real time.

User preferences within the static model will prioritize generation source demands and adjust pricing according to allocation of service in real time. Dynamic data fed back from the generation model will determine if dispatched generation has been consumed by the appropriate user.

This implementation provides closure between generation and consumption for any individual electric power source and to allow participation of generation and consumers at any level of grid traffic. Additionally or alternatively, this implementation allows consumers to set pricing and allow bidding for selected electrical generation sources.

Like other levels of the virtualized model, the virtualized generation level 502 will hold two models: one dynamic and one static. The static model will present generational source request fed from the market transaction level to ISO's 504 and other grid participants, either remote 505 or local 503. The dynamic virtualized model will verify generational sources and actual costs in real time. The comparison between these two model values for each source will feed back real incremental costing data to the market transaction level. Although some variation of this invention could be developed using multi-tier concepts or abstraction layer techniques, in order to combine all functions into a single model or some variation thereof, this novel concept of using two comparable models would be emulated.

This implementation allows ISOs 505 to continue to control and dispatch electrical power to the grid but access resources in the grid according to consumer demand for a particular generated source; either by type or location. Additionally or alternatively, this implementation allows participants to generate power and those not currently tracked by ISOs 503 are given real time source and cost consideration over the entire grid virtualized model.

It is understood that some generational sources such as wind and solar create fluctuations in the grid and the fluctuations are handled in real time within the dynamic virtualized generational model. And ancillary sources are created through software to compensate and balance the adverse effects to power loading by adjusting consumption through the virtualized consumption model. This information in turn is fed back to the market transaction level to reestablish allocation of services and pricing levels in real time.

The virtualized generational model will identify all costs associated with generation and delivery in order to normalize all costs to dispatch electrical energy from any particular source to any selected consumer. This would include such costs as carbon sequestration for fossil fuels and radioactive disposal/storage for nuclear generated power.

Benefits of Implementation

A virtualized model can contain information that can be presented in any form necessary to interface with simple human interaction or complex machine to machine interface. This allows for simple local user interface with complex control algorithms handled off site in the cloud environment.

By placing generation devices into a single virtualized model, it is possible to make small changes within each generational source and related ancillary devices to affect demand response and power factor loading.

By placing generational devices into a single virtualized model and using input data, it is possible to identify and segregate multiple generational source types, either remote or local, into a unique generation type and allocate the total across multiple users in real time.

By placing generational devices into a single virtualized model, it is possible to identify all costs associated with creating electrical energy and delivery to any point within the grid. This would include both short term and long term environmental costs.

By placing generational devices into a single virtualized model, it is possible to create a tiered pricing structure and allow users/consumers to interface with pricing and generational information that is pertinent to that user.

By placing generational devices into a single virtualized model, it is possible to allow users/consumers to create social groups to affect pricing and demand for specific types/locations of generational sources.

Figure 9:
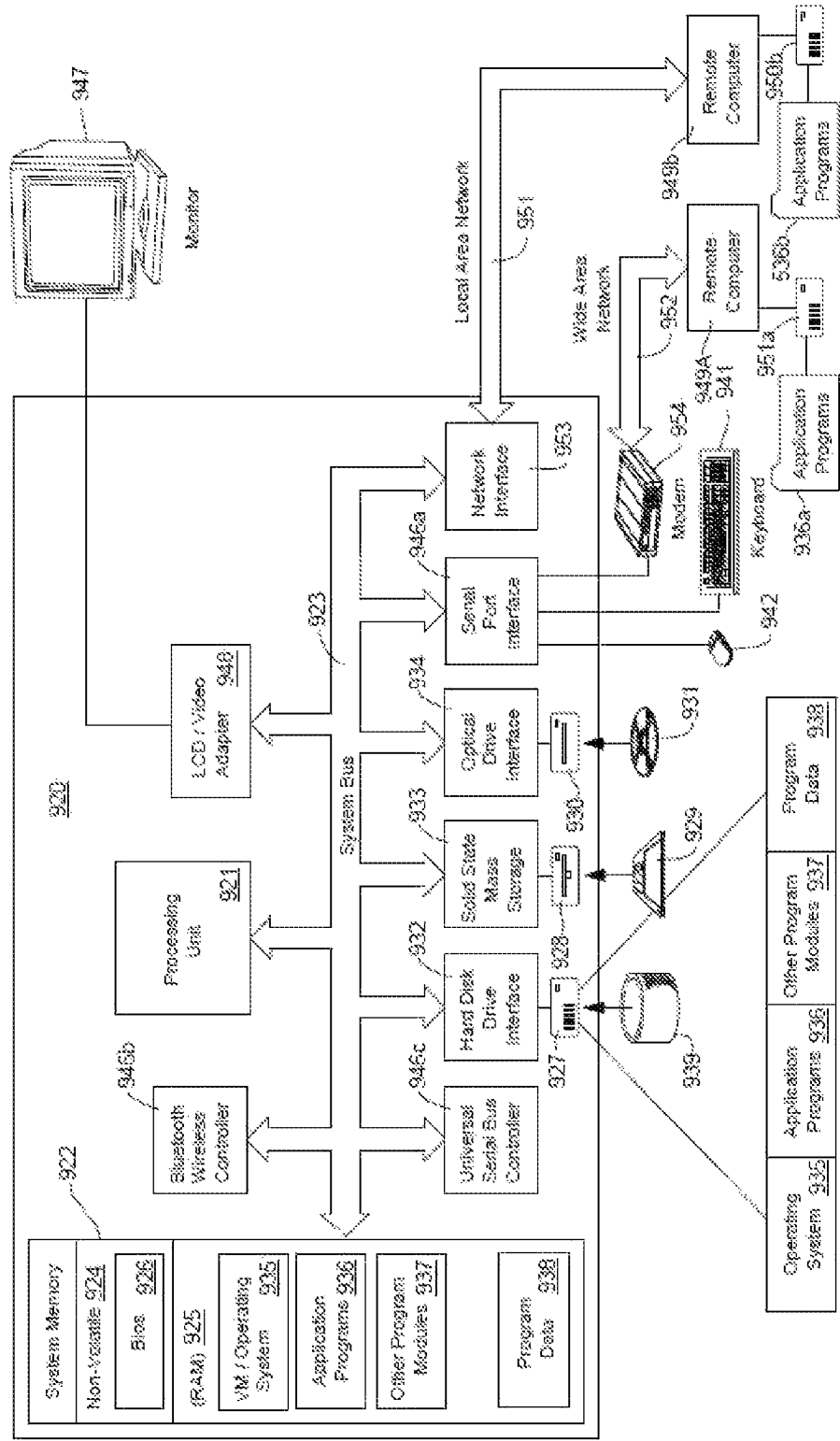
FIG. 9 illustrates an example of a suitable computing environment in which the invention may be implemented.

FIG. 9, and the following discussion, are intended to provide a brief, general description of a suitable computing environment in which the invention may be implemented. Although not required, the invention will be described in the general context of computer-executable instructions, such as program modules, being executed by computers in network environments. Generally, program modules include routines, programs, objects, components, data structures, etc. that performs particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

One of skill in the art will appreciate that the invention may be practiced in network computing environments with many types of computer system configurations, including personal computers, hand-held devices, mobile phones, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

With reference to FIG. 9, an example system for implementing the invention includes a general purpose computing device in the form of a conventional computer 920, including a processing unit 921, a system memory 922, and a system bus 923 that couples various system components including the system memory 922 to the processing unit 921. It should be noted however, that as mobile phones become more sophisticated, mobile phones are beginning to incorporate many of the components illustrated for conventional computer 920. Accordingly, with relatively minor adjustments, mostly with respect to input/output devices, the description of conventional computer 920 applies equally to mobile phones. The system bus 923 may be any of several types of bus structures including a memory bus or memory controller, a peripheral bus, and a local bus using any of a variety of bus architectures. The system memory includes non-volatile memory 924 and random access memory (RAM) 925. A basic input/output system (BIOS) 926, containing the basic routines that help transfer information between elements within the computer 920, such as during start-up, may be stored in memory 924.

The computer 920 may also include a magnetic hard disk drive 927 for reading from and writing to a magnetic hard disk 939, a solid state drive 928 for reading from or writing to a removable memory card 929, and an optical disc drive 930 for reading from or writing to removable optical disc 931 such as a CD-ROM or other optical media. The magnetic hard disk drive 927, magnetic disk drive 928, and optical disc drive 930 are connected to the system bus 923 by an interface 932, a magnetic disk drive-interface 933, and an optical drive interface 934, respectively. The drives and their associated computer-readable media provide nonvolatile storage of computer-executable instructions, data structures, program modules and other data for the computer 920. Although the exemplary environment described herein employs a magnetic hard disk 939, a removable memory card 929 and a removable optical disc 931, other types of computer readable media for storing data can be used, including magnetic cassettes, removable magnetic memory disks, digital versatile discs, Bernoulli cartridges, RAMs, ROMs, and the like.

Program code means comprising one or more program modules may be stored on the hard disk 939, memory card 929, optical disc 931, non-volatile memory 924 or RAM 925, including an operating system 935, one or more application programs 936, other program modules 937, and program data 938. A user may enter commands and information into the computer 920 through keyboard 940, pointing device 942, or other input devices (not shown), such as a microphone, push button, touch pad, thermal sensors, scanner, motion detectors or the like. These and other input devices are often connected to the processing unit 921 through a serial port interface 946a coupled to system bus 923. Alternatively, the input devices may be connected by other interfaces, such as a parallel port, Bluetooth port 946b or a universal serial bus (USB) 946c. A monitor 947 or another display device is also connected to system bus 923 via an interface, such as video adapter 948. In addition to the monitor, personal computers typically include other peripheral output devices (not shown), such as speakers and printers.

The computer 920 may operate in a networked environment using logical connections to one or more remote computers, such as remote computers 949a and 949b. Remote computers 949a and 949b may each be another personal computer, a server, a router, a network PC, a peer device or other common network node, and typically include many or all of the elements described above relative to the computer 920, although only memory storage devices 950a and 950b and their associated application programs 936a and 936b have been illustrated in FIG. 9. The logical connections depicted in FIG. 9 include a local area network (LAN) 951 and a wide area network (WAN) 952 that are presented here by way of example and not limitation. Such networking environments are commonplace in office-wide or enterprise-wide computer networks, intranets and the Internet.

When used in a LAN networking environment, the computer 920 can be connected to the local network 951 through a network interface or adapter 953. When used in a WAN networking environment, the computer 920 may include a modem 954, a wireless link, or other means for establishing communications over the wide area network 952, such as the Internet. The modem 954, which may be internal or external, is connected to the system bus 923 via the serial port interface 946. In a networked environment, program modules depicted relative to the computer 920, or portions thereof, may be stored in the remote memory storage device. It will be appreciated that the network connections shown are exemplary and other means of establishing communications over wide area network 952 may be used.

As used in the specification and the claims, the phrase "configured to" denotes an actual state of configuration that fundamentally ties recited elements to the physical characteristics of the recited structure. As a result, the phrase "configured to" reaches well beyond merely describing functional language or intended use since the phrase actively recites an actual state of configuration.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A virtual thermostat for virtualizing energy functions and processes, the virtual thermostat comprising:
    a sensor array, wherein the sensor array includes:
        an interior temperature sensor at a thermostat location, wherein the interior temperature sensor is configured to measure a temperature within an interior space;
        an outdoor temperature sensor, wherein the outdoor temperature sensor is configured to measure a temperature of an outdoor location in proximity to the interior space, wherein the outdoor temperature sensor is located approximately four (4) feet above grade and away from any heat source or radiant influence; and
a supply air temperature sensor, wherein the supply air temperature sensor is configured to measure the temperature of conditioned air that is being supplied to the interior space;
a controller communicatively configured to model and control the energy consumption of devices based on the input from the sensor array;
an occupancy sensor configured to establish occupant conditions by reading skin temperatures and reading a surrounding temperature;
a radiant temperature sensor configured to measure radiant temperatures for creating radiant mean conditions, wherein the radiant temperature sensor is configured to measure the radiant temperature of a surface within the interior space, and wherein the radiant temperature sensor includes:
a frame configured to be mounted to an interior surface of an exterior wall of a building, the frame configured to be thermally isolated from the exterior wall, and the frame comprising:
a first IR sensor arranged to sense a temperature of the interior surface of the exterior wall;
a thermocouple configured to sample surrounding air; and
a second IR sensor disposed to measure a temperature of the surroundings; and
one or more computer readable media, wherein the one or more computer readable media contain a set of computer-executable instructions to be executed by a logic device, the set of computer-executable instructions configured to:
receive input from the sensor array;
create a unique representation of the physical systems controlled;
create a unique data set of virtualized systems and connect this data set to devices, connected to the virtual thermostat, using machine to machine interaction;
allow the virtual thermostat to share user data and user requests with other consumption or generational models;
allow the data set representing the virtual thermostat to exist outside of the controlled system; and
employ control logic/algorithms to output one or more control signals designed to affect the desired energy response.

2. The virtual thermostat of claim 1, wherein each of the sensors in the sensor array provide data to allow the virtual thermostat to measure second order equation responses in order to predict system performance as the basis of a virtualized consumption model.

3. The virtual thermostat of claim 1, wherein the sensor array further includes a sensor configured to:
read surface temperature of a structure that the sensor is mounted upon using infrared means; and
forward data to the virtual thermostat define space conditions resulting in optimized thermal comfort for a least energy cost.

4. The virtual thermostat of claim 3, wherein the sensor includes at least one of:
an ear device, a wrist device, a lapel device, or a smart device that is connected to the virtual thermostat using Bluetooth standard.

5. The virtual thermostat of claim 4, wherein the sensor is configured to:
register with the virtual thermostat to identify multiple occupants, wherein the registration allows the virtual thermostat to receive the occupant's consumption preferences and variables and track multiple occupants with the total energy use, source, and cost apportioned over each occupant.

6. The virtual thermostat of claim 3, wherein the sensor includes at least one of: an ear device, a wrist device, a lapel device, or a smart device.

7. The virtual thermostat of claim 1, wherein the sensor array includes at least one of: an ear device, a wrist device, a lapel device, or a smart device that is configured to be coupled to the virtual thermostat using Bluetooth standard.

8. The virtual thermostat of claim 1, wherein the sensor array includes a sensor configured to:
register with the virtual thermostat to identify multiple occupants, wherein the registration allows the virtual thermostat to receive the occupant's consumption preferences and variables and track multiple occupants with the total energy use, source, and cost apportioned over each occupant.

9. The virtual thermostat of claim 1 wherein the sensor array further includes a sensor configured to read a surface temperature of a structure that the sensor is mounted upon.

10. The virtual thermostat of claim 8 wherein sensor configured to read a surface temperature of a structure that the sensor is mounted upon comprises an IR sensor.

11. The virtual thermostat of claim 9 wherein the sensor array further includes a sensor configured to forward data to define space conditions resulting in a thermal range for an energy cost.

12. The virtual thermostat of claim 1 wherein the sensor array further includes a sensor configured to forward data to define space conditions resulting in a thermal range for an energy cost.

13. The virtual thermostat of claim 1 wherein sensors in the sensor array are configured to provide data to measure second order equation responses.

14. The virtual thermostat of claim 1 wherein the sensor array comprises a sensor configured to provide data to measure second order equation responses.

15. The virtual thermostat of claim 1, further comprising means for predicting system performance as the basis of a virtualized consumption model.

16. The virtual thermostat of claim 1, wherein the sensor array further comprises a sensor comprising at least one of: an ear device, a wrist device, a lapel device, or a smart device capable of communicating in accordance with a Bluetooth communication protocol.

17. The virtual thermostat of claim 1, wherein the sensor array includes a sensor configured to identify multiple occupants and track a total energy use, a source, and a cost for each occupant.

18. The virtual thermostat of claim 1, wherein the sensor array includes a sensor configured to identify multiple occupants and track a total energy use, a source, and a cost for each occupant wherein the cost is apportioned over each occupant.

* * * * *